(12) United States Patent
Tanaka

(10) Patent No.: US 10,727,179 B2
(45) Date of Patent: Jul. 28, 2020

(54) SEMICONDUCTOR DEVICE AND AMPLIFIER CIRCUIT

(71) Applicant: RENESAS ELECTRONICS CORPORATION, Tokyo (JP)

(72) Inventor: Keiichiro Tanaka, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 73 days.

(21) Appl. No.: 15/985,233

(22) Filed: May 21, 2018

(65) Prior Publication Data

US 2018/0374794 A1    Dec. 27, 2018

(30) Foreign Application Priority Data

Jun. 27, 2017    (JP) .................................. 2017-125208

(51) Int. Cl.
| | | |
|---|---|---|
| H03F 3/14 | (2006.01) | |
| H01L 23/522 | (2006.01) | |
| H03F 1/56 | (2006.01) | |
| H01L 49/02 | (2006.01) | |
| H03F 3/45 | (2006.01) | |

(52) U.S. Cl.
CPC ...... *H01L 23/5227* (2013.01); *H01L 23/5225* (2013.01); *H01L 28/10* (2013.01); *H03F 1/565* (2013.01); *H03F 3/45475* (2013.01)

(58) Field of Classification Search
CPC ........ H03F 1/565; H03F 3/45475; H03F 3/04; H03F 3/45479
USPC .......................... 330/307, 107, 69, 109, 291
See application file for complete search history.

(56) References Cited

U.S. PATENT DOCUMENTS 7,095,307 B1 *  8/2006  Barrett ................ H01L 23/5227
                                                              336/200

FOREIGN PATENT DOCUMENTS

JP        2014-086593 A    5/2014

* cited by examiner

*Primary Examiner* — Khanh V Nguyen
*Assistant Examiner* — Khiem D Nguyen
(74) *Attorney, Agent, or Firm* — McDermott Will & Emery LLP

(57) ABSTRACT

In order to easily sort failures due to short circuit between wires in an inductor, a semiconductor device includes a plurality of inductors (first inductor, second inductor) formed in a plurality of wiring layers. In each of the wiring layers, the metal layer of the first inductor and the metal layer of the second inductor respectively extend around the peripheral region from the inner periphery to the outer periphery in the same direction. The metal layer of the first inductor and the metal layer of the second inductor are arranged so as to be adjacent to each other.

12 Claims, 4 Drawing Sheets

SEMICONDUCTOR DEVICE AND AMPLIFIER CIRCUIT

CLAIM OF PRIORITY

The present application claims priority from Japanese patent application JP 2017-125208 filed on Jun. 27, 2017, the content of which is hereby incorporated by reference into this application.

FIELD OF THE INVENTION

The present invention relates to a semiconductor device including an inductor formed in a wiring layer and to an amplifier circuit using the inductor.

BACKGROUND OF THE INVENTION

Inductors are used in power meters for detecting the amount of power flowing through a power line. When the amount of power flowing through a power line changes, the strength of magnetic field generated from the power line is changed, and electric power is generated in the inductor according to the change of the magnetic field. The power meter detects the amount of power flowing through the power line by monitoring electric power generated in the inductor.

Patent Document 1 (Japanese Unexamined Patent Application Publication No. 2014-86593) discloses a semiconductor device provided with an inductor for detecting electric power by using a wiring layer around an internal circuit.

SUMMARY OF THE INVENTION

When an inductor is used as a magnetic sensor, the greater the number of turns of the inductor (coil), the higher is the sensor sensitivity. Thus, in the semiconductor device disclosed in Patent Document 1, the inductor is implemented by winding several turns of wire in each of a plurality of wiring layers.

In order to increase the number of turns of the inductor, the wiring interval between inductors, each of which is formed by winding several turns of wire, is made narrow. However, it is inevitable that adhesion of particles (dust) occurs with a certain probability in the semiconductor manufacturing process. When particles adhere between wires configuring inductors, a short circuit occurs between the wires. In this case, the inductors have the same potential in terms of a DC and can function as inductors even if a short circuit occurs. However, this is equivalent to saying that the number of turns of the inductor is reduced due to the short circuit. In other words, the electromotive force is reduced by the number of short-circuited wires, resulting in a reduction in the magnetic sensor characteristics. For this reason, it is desirable to sort out the semiconductor device in which short circuit occurs in the inductor, but this sorting has been difficult in the conventional technique.

The magnetic sensor is designed to generate the electromotive force by magnetism that is generated when the current flows through the power line and so it is difficult to directly measure the characteristics by a normal semiconductor tester, in which detection of failure has been performed by measuring the serial resistance value of the inductor. However, the variation in the resistance value of the wiring layer generally exceeds 10%. For this reason, when wires configuring inductors are short circuited in the semiconductor manufacturing process, it is difficult to determine a failure by the semiconductor tester unless the measured resistance value greatly exceeds the variation range of the wiring layer resistance value.

Thus, it is difficult to sort out the characteristic deterioration and increasing variation of the magnetic sensor due to a short circuit between wires of inductors, and an additional mechanism is required to compensate them depending on the required accuracy of the sensor. This will lead to an increase in the number of parts of the power meter, so that it is desirable to be able to sort out the semiconductor device in which deterioration occurs due to a short circuit between wires in inductors.

The above and other objects and novel features of the present invention will become apparent from the description of the present specification and the accompanying drawings.

A plurality of inductors (first inductor, second inductor) is formed in a plurality of wiring layers. In each of the wiring layers, the metal layer of the first inductor and the metal layer of the second inductor respectively extend around from the inner periphery to the outer periphery in the same direction. The metal layer of the first inductor and the metal layer of the second inductor are arranged to be adjacent to each other.

It is possible to easily soft wiring failure in inductors formed in the semiconductor device.

DETAILED DESCRIPTION OF THE PREFERRED EMBODIMENTS

First Embodiment

Figure 1:
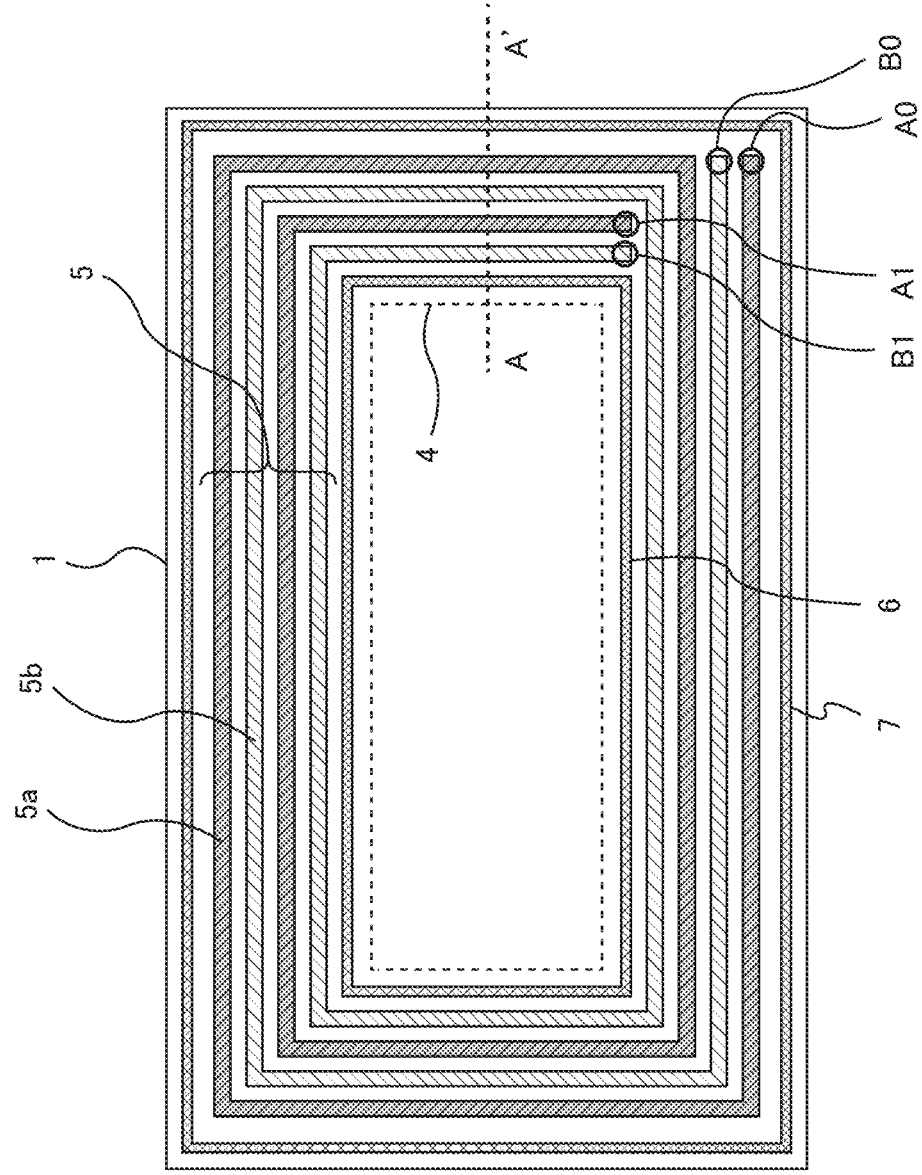
FIG. 1 is a plan view showing the configuration of a semiconductor device according to a first embodiment.
Figure 2:
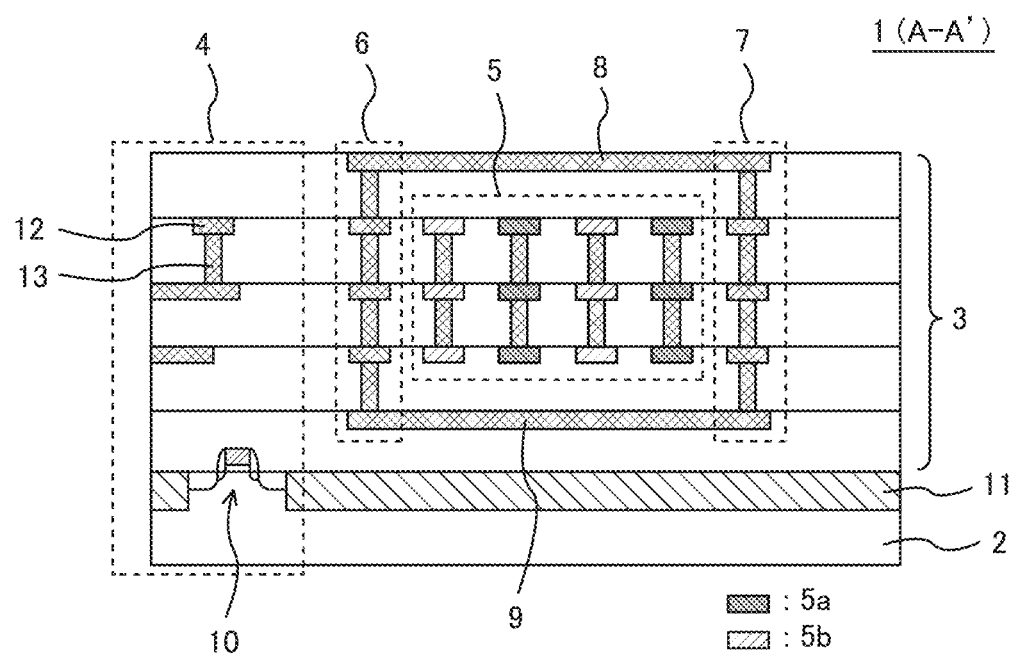
FIG. 2 is a cross-sectional view taken along line A-A' of FIG. 1 according to the first embodiment.

FIG. 1 is a plan view showing the configuration of a semiconductor device 1 according to a first embodiment. FIG. 2 is a cross-sectional view taken along line A-A' of FIG. 1. The configuration of the semiconductor device 1 will be described with reference to FIGS. 1 and 2.

The semiconductor device 1 includes a substrate 2, a multilayer wiring layer 3, an internal circuit region 4, an inductor 5, and shielding members 6 to 9. The shielding members 6 to 9 surround the inductor 5 on the upper, lower, left and right sides to prevent the noise, which is generated by the inductor 5, from propagating to the internal circuit region 4, or to prevent the noise, which is generated by the internal circuit formed in the internal circuit region 4, or the external noise from penetrating into the inductor 5.

The semiconductor device 1 configures a magnetic sensor, in which at least an amplifier circuit is formed in the internal circuit region 4. The internal circuit region 4 includes a transistor 10 that configures the amplifier circuit, and the like. The transistor 10 is formed on the substrate 2. Note that an element isolation film 11 is formed on the substrate 2 to isolate the element formation region, in which the transistor 10 is formed, from other areas.

The multilayer wiring layer 3 is formed over the transistor 10 and the element isolation film 11. The multilayer wiring layer 3 includes a plurality of wiring layers. Each wiring layer has an inner wire 12 and a via 13 for coupling internal wires of different layers. The inner wires are electrically isolated from each other by an insulating film. In the example in the figure, the inner wire 12 is embedded in the insulating film. However, it may also be possible that the inner wire 12 is formed on the insulating film. The inner wire 12 includes wires that configure the circuit of the internal circuit region 4 and power source wires.

The inductor 5 is formed in the same layer as at least one inner wire 12 in the periphery of the internal circuit region. It is preferable that the inductor 5 is formed by using a plurality of wiring layers as shown in the figure. This is because by forming the inductor 5 with a plurality of wiring layers, it is possible to increase the sensitivity for detecting changes in the magnetic field by the inductor 5. The configuration of the inductor 5 will be described later. The inductor 5 is formed with wiring layers from the second or upper wiring layer to at least the wiring layer below the uppermost layer.

Both the first shielding member 6 and the second shielding member 7 are continuously formed from the wiring layer below the wiring layer in which the inductor 5 is formed to the wiring layer above the wiring layer in which the inductor 5 is formed. Both the first shielding member 6 and the second shielding member 7 are configured such that a metal layer in the same layer as the inner wire 12, as well as a slit via in the same layer as the via 13 are formed in the entire periphery in each wiring layer. In this way, the first shielding member 6 and the second shielding member 7 are formed as wall metal layers. Note that it may also be possible to provide a columnar via at a predetermined interval, instead of the slit via.

Further, an upper shielding member 8 is formed in the wiring layer just above the wiring layer in which the inductor 5 is formed, and a lower shielding member 9 is formed in the wiring layer just below the wiring layer in which the inductor 5 is formed. The upper shielding member 8 is formed in such a way that the uppermost metal layer of the first shielding member 6 and the uppermost metal layer of the second shielding member 7 are joined together. The upper shielding member 8 covers the upper part of the inductor 5. The lower shielding member 9 is formed in such a way that the lowermost metal layer of the first shielding member 6 and the lowermost metal layer of the second shielding member 7 are joined together. The lower shielding member 9 covers the lower part of the inductor 5.

The configuration of the inductor 5 according to the first embodiment will be described. The inductor 5 includes a first inductor 5a and a second inductor 5b that are separated from each other. In each of the wiring layers, the metal layer configuring the first inductor 5a and the metal layer configuring the second inductor 5b, respectively, extend around the peripheral region in the same direction from the inner periphery to the outer periphery. The metal layer configuring the first inductor 5a and the metal layer configuring the second inductor 5b are arranged to be adjacent to each other. Further, the metal layer of the first inductor formed in a certain wiring layer is placed in the same position as the metal layer of the first inductor formed in the wiring layer directly above and/or directly below the metal layer of the first inductor formed in the certain wiring layer, in a plan view. At the same time, the metal layer of the second inductor formed in a certain wiring layer is placed in the same position as the metal layer of the second inductor formed in the wiring layer just above and/or just below the metal layer of the second inductor formed in the certain wiring layer, in a plan view. In other words, in the wiring layer in which the inductor 5 is formed, the metal layer configuring the first inductor 5a is present in the wiring layer just above and/or just below the metal layer configuring the first inductor 5a, and the metal layer configuring the second inductor 5b is present in the wiring layer just above and/or just below the metal layer configuring the second inductor 5b. Then, the metal layers of the first inductor 5a formed in a plurality of wiring layers are coupled to each other through slit vias or columnar vias at predetermined intervals. Similarly, the metal layers of the second inductor 5b formed in a plurality of wiring layers are coupled to each other through slit vias or columnar vias at predetermined intervals. In order to form the inductor virtually as a single layer, it is preferable that the interlayer coupling in the inductor 5 is done with the resistance as low as possible. In the inductor according to the first embodiment, it is possible to increase the sensor sensitivity by forming a low resistance coil by winding several turns of wire. Note that although the plan layout of the inductor 5 is simplified in the figure, the inductor is formed by winding dozens of turns of wire around the metal layer in each wiring layer in order to increase the sensor sensitivity. Further, the inductor 5a and the inductor 5b are not required to run side by side all the way and there may be areas where the inductors do not run side by side, partially, such as ends of inductors. However, in the areas where the inductors do not run side by side, it is preferable that the inductors 5a and the inductors 5b are respectively arranged at least at minimum intervals so that they are not adjacent to each other.

The connection relationship between an operational amplifier circuit 31 formed in the internal circuit region 4 and the inductor 5 will be described with reference to FIG. 1n the example in FIG. 3, a non-inverting input (+) of the operational amplifier circuit 31 is coupled to a reference potential ($v_{ref}$) through the first inductor 5a, and an inverting input (−) of the operational amplifier circuit 31 is coupled to the reference potential ($v_{ref}$) through the second inductor 5b and a resistance 32. An output of the operational amplifier circuit 31 is fed back to a potential point 34 through a resistance 33. Here, the second inductor 5b is coupled in the opposite phase to the first inductor 5a. In the example in the figure, an end portion A1 of the first inductor 5a is coupled to the reference potential side, an end portion A0 of the first inductor 5a is coupled to the non-inverting input (+) side of the operational amplifier circuit 31, an end portion B1 of the second inductor 5b is coupled to the inverting input (−) side of the operational amplifier circuit 31, and an end portion B0 of the second inductor 5b is coupled to the reference potential (resistance 32) side. Of course, the coupling of the first inductor 5a and the second inductor u can be reversed. With this coupling, the electromotive force generated by the magnetism generated when the current flows through the power line is reversed between the first inductor 5a and the second inductor 11b. Thus, it is possible to add and amplify the electromotive force by the operational amplifier circuit 31.

With the configuration of the first embodiment, the metal layer configuring the inductor 5 has a potential different from that of other metal layers adjacent to the particular metal layer on the left and right sides. Thus, it is possible to reliably remove the short circuit failure of the inductor 5 by performing an open/short test between the first inductor 5a and the second inductor 5b in the sorting step of the semiconductor device. Further, of the parameters, only the sensor area affects the characteristics of the magnetic sensor and the variation can be considered to be zero. Thus, the characteristic deterioration/variation of the magnetic sensor with the configuration of the first embodiment can be virtually zero.

As a variation of the first embodiment, instead of interlayer coupling of the inductor 5 shown in FIG. 2, the metal layer configuring the first inductor 5a formed in each wiring layer can be coupled at its end in series to the metal layer configuring the first inductor 5a formed in the wiring layer just above and/or just below. Similarly, the metal layer configuring the second inductor 5b can be coupled at its end in series to the metal layer configuring the second inductor 5b formed in the wiring layer just above and/or just below. In this case, the metal layers of the respective wiring layers that configure the first inductor 5a or the second inductor 5b are all coupled in the same phase.

In the inductor according to the variation, when assuming that the width of the metal layer formed in each wiring layer is the same as the first embodiment, the parasitic resistance of the inductor increases by approximately a multiple the number of layers formed as compared to the inductor according to the first embodiment. However, it is possible to increase the sensor sensitivity by increasing the number of turns of the coil. Further, in the configuration of the variation, the metal layer configuring the inductor 5 has a potential different from that of other metal layers adjacent to the particular metal layer on the left and right sides in each wiring layer. Thus, it is possible to reliably remove the short-circuit failure of the inductor 5 in each wiring layer by performing an open or a short-circuit test between the first inductor 5a and the second inductor 5b in the sorting step of the semiconductor device. On the other hand, short circuit failure detection is difficult when the metal layer configuring the first inductor 5a formed in a certain wiring layer and the metal layer configuring the first inductor 5a formed in a the wiring layer just above and/or just below are short circuited to each other. This is true for the second inductor 5b. However, in the variation, it is possible to sort a short circuit between inductors formed in the same layer. As a result, the occurrence of characteristic deterioration and variation in the magnetic sensor can be reduced more than before.

Second Embodiment

Figure 4:
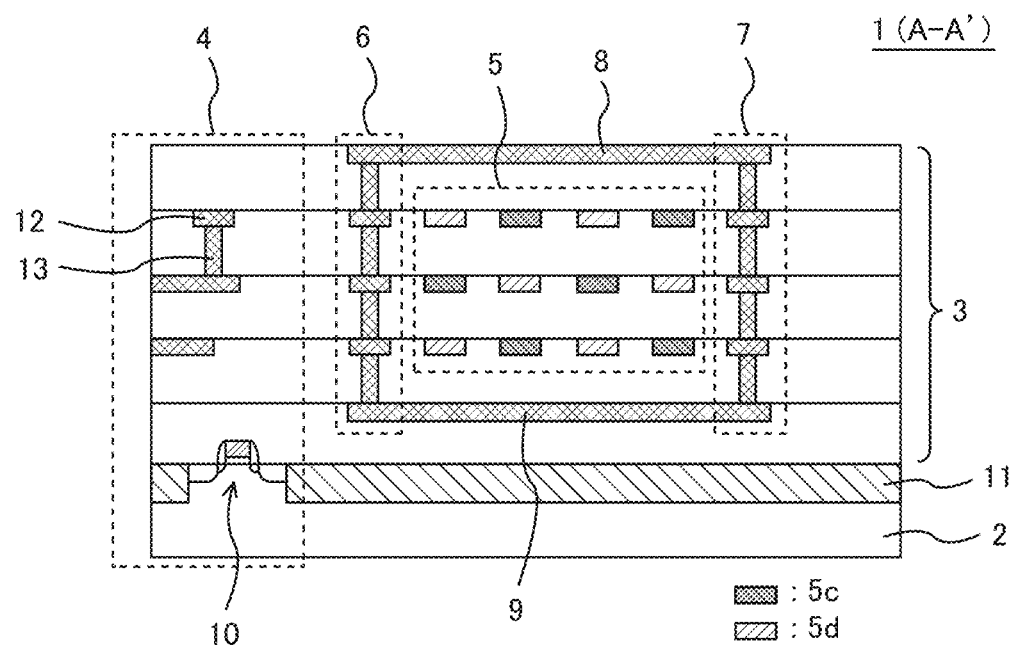
FIG. 4 is a cross-sectional view taken along line A-A' of FIG. 1 according to a second embodiment.

A second embodiment is different from the first embodiment in the configuration of the inductor 5. FIG. 4 shows a cross-sectional view of a semiconductor device according to the second embodiment, which is equivalent to the cross-sectional view taken along line A-A' shown in FIG. 1.

The configuration of the inductor 5 according to the second embodiment will be described. The inductor 5 includes a first inductor 5c and a second inductor 5d that are separated from each other. In each of the wiring layers, the metal layer configuring the first inductor 5c and the metal layer configuring the second inductor 5d are arranged to be adjacent to each other in the same manner as the first embodiment. Thus, in the plan view of FIG. 1, the first inductor 5a can be replaced with the first inductor 5c and the second inductor 5b canoe replaced with the second inductor 5d. In the second embodiment, the plan layout of the first inductor 5c and the second inductor 5d is different in each wiring layer. The metal layer of the first inductor formed in a certain wiring laver is placed in a position different from the metal layer of the first inductor formed in the wiring layer just above and/or just below in a plan view. Further, the metal layer of the second inductor formed in a certain wiring layer is placed in a position different from the metal layer of the second inductor formed in the wiring layer just above and/or just below in a plain view.

In the example in FIG. 4, in the wiring layer in which the inductor 5 is formed, the metal layer configuring the second inductor 5d is provided in the wiring, layer just above and/or just below the metal layer configuring the first inductor 5c. Further, the metal layer configuring the first inductor 5c is provided in the wiring layer just above and/or just below the metal layer configuring the second inductor 5d. Note that the metal layer configuring the first inductor 5c formed in each wiring layer is coupled its end in series to the metal layer configuring the first inductor 5c formed in the wiring layer just above and/or just below. Similarly, the metal layer configuring the second inductor 5d is coupled at its end in series to the metal layer configuring the second inductor 5d formed in the wiring layer just above and/just below. Here, the metal layers of the respective wiring layers configuring the first inductor 5c or the second inductor 5d are all coupled in the same phase.

In the inductor according to the second embodiment, when assuming that the width of the metal layers formed in the respective wiring layers are the same, the parasitic resistance of the inductor increases by approximately a multiple the number of layers formed as compared to the inductor according to the first embodiment. However, it is possible to increase the sensor sensitivity by increasing the number of turns of the coil. Further, in the configuration of the second embodiment, the metal layer configuring the inductor 5 has a potential different from that of other metal layers adjacent to the particular metal layer on the left and right sides in each wiring layer. Thus, it is possible to reliably remove the short circuit failure in the inductor 5 in each wiring layer by performing an open or a short-circuit test between the first inductor 5c and the second inductor 5d. On the other hand, short circuit failure detection is difficult when the metal layer configuring the first inductor 5c formed in a certain wiring layer and the metal layer configuring the first inductor 5c that is formed just above and/or just below are short circuited to each other. This is true for the second inductor 5d. However, the arrangement of the metal layers configuring the first inductor 5c and the metal layers configuring the second inductor 5d is different in each wiring layer, in a plan view. Thus, the metal layers configuring the first inductor 5c in different layers or the metal layers configuring the second inductor 5d in different layers can be provided at a distance greater than that of the variation of the first embodiment. Also in the second embodiment, it is possible to sort a short circuit between inductors formed in the same layer, and to reduce the occurrence of short circuit between layers more than in the variation of the first embodiment. As a result, the occurrence of characteristic deterioration and variation in the magnetic sensor can be reduced more than before.

Hereinafter, the variation common to the semiconductor devices described as the first and second embodiments will be described.

Figure 5:
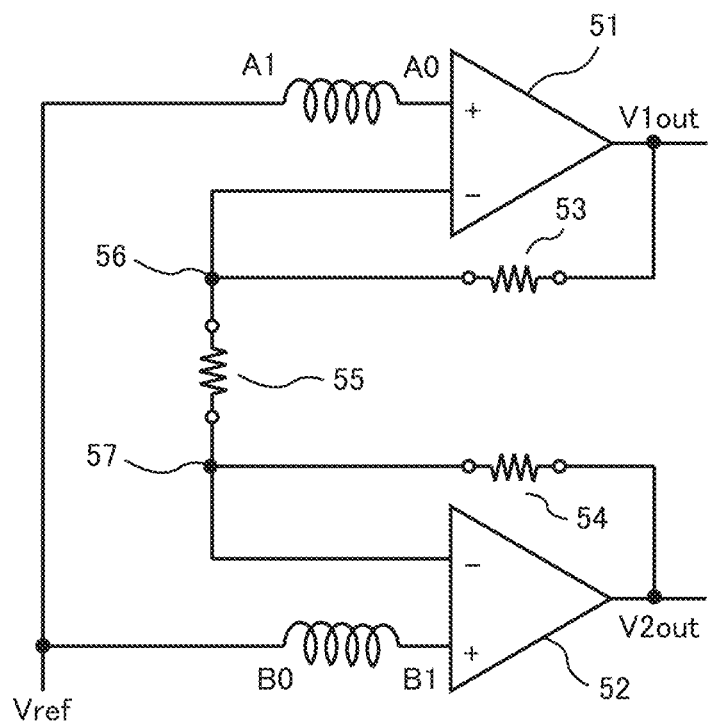
FIG. 5 is a diagram showing the connection relationship between amplifiers.

FIG. 5 is a configuration example of an amplifier circuit formed in the internal circuit region 4. The non-inverting input (+) of an operational amplifier circuit 51 is coupled to a reference potential ($v_{ref}$) through the first inductor 5a (5c), and the non-inverting input (+) of an operational amplifier circuit 52 is coupled to the reference potential ($V_{ref}$) through the second inductor 5b (5d). An output ($V1_{ou}$) of the operational amplifier circuit 51 is fed back to a potential point 56 through a resistance 53, and an output (V2$_{out}$) of the operational amplifier circuit 52 is fed back to a potential point 57 through a resistance 54. The potential point 56 and the potential point 57 are coupled to each other through a resistance 55. The first inductor 5a (5c) and the second inductor 5b (5d) are coupled in opposite phase to each other. For example, in the case of the inductor configuration of the first embodiment, the end portion A1 of the first inductor 5a is coupled to the reference potential side, the end portion A0 of the first inductor 5a is coupled to the non-inverting input (+) side of the operational amplifier circuit 51, the end portion B0 of the second inductor 5b is coupled to the reference potential side, and the end portion B1 of the second inductor 5b is coupled to the non-inverting input (+) side of the operational amplifier circuit 52.

Figure 3:
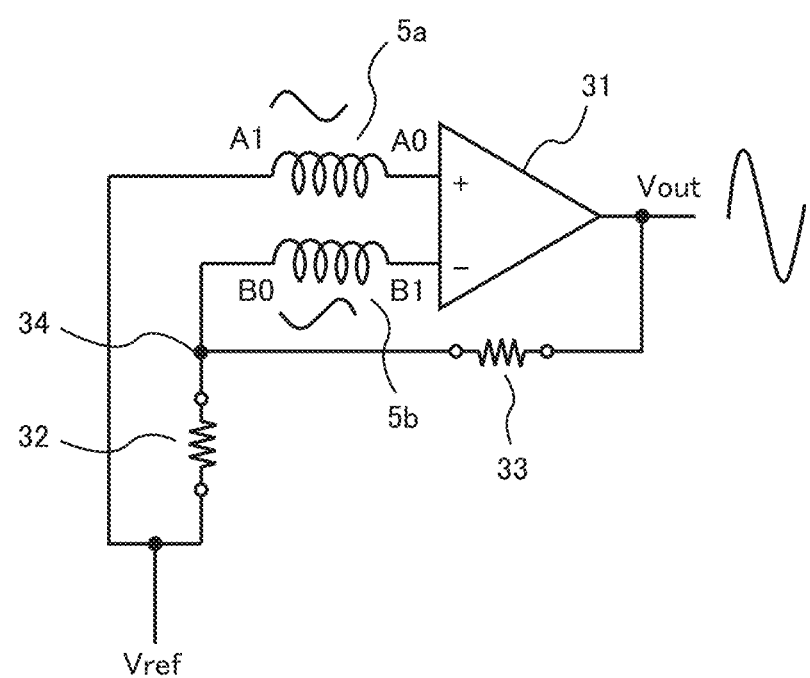
FIG. 3 is a diagram showing the connection relationship between an amplifier circuit and an inductor.
Figure 6:
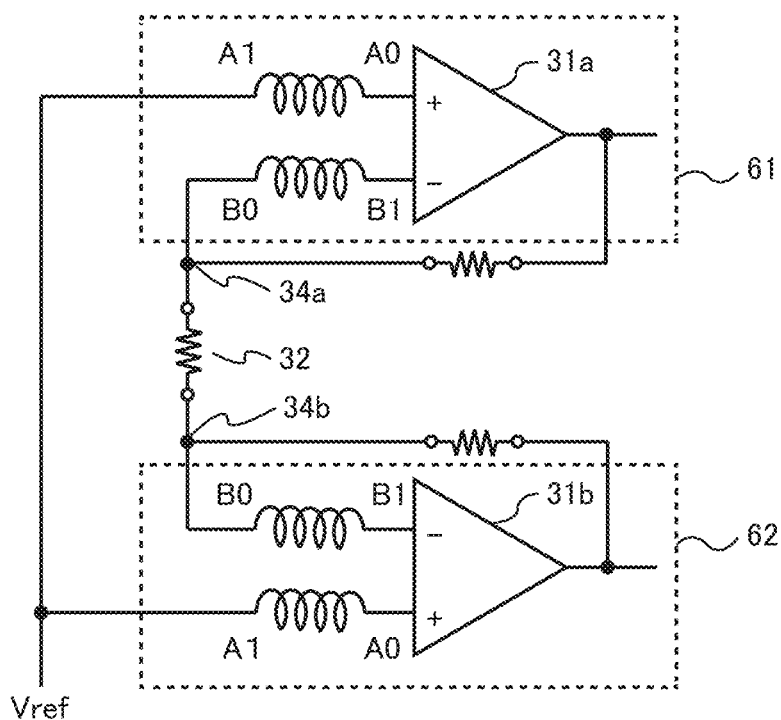
FIG. 6 is a diagram showing the connection relationship between amplifiers.

Note that although the amplifier circuit in FIG. 5 is implemented as an internal circuit of one chip, it is also possible to configure the amplifier circuit by using two chips as semiconductor devices each having the operational amplifier circuit shown in FIG. 3. FIG. 6 shows the circuit configuration. The non-inverting input (+) of an operational amplifier circuit 31a of a semiconductor device 61 is coupled to the reference potential (V$_{ref}$) through the first inductor 5a (5c), the non-inverting input (+) of an operational amplifier circuit 31b is coupled to the reference potential (v$_{ref}$) through the first inductor 5a (5c). Further, the potential point 34a and the potential point 34b are coupled to each other through the resistance 32. Since the amplifier circuit is configured with two chips as described above, it is possible to detect current with high accuracy while cancelling the external noise by detecting the same magnetic fields at different positions.

While the invention made by the present inventors has been concretely described based on exemplary embodiments, the present invention is not limited to the specific exemplary embodiments. It is apparent to those skilled in the art that various modifications and variations can be made without departing from the scope of the present invention. For example, in addition to the amplifier circuit, the internal circuit region can also be provided with an A/C converter for converting the analog signal detected in the amplifier circuit into a digital signal, as well as an arithmetic processing circuit for calculating the output from the A/D converter.

LIST OF REFERENCE SINGS

1: semiconductor device, 2: substrate, 3: multilayer wiring layer, 4: internal circuit region, 5: inductor, 6: first shielding member, 7: second shielding member, 8: upper shielding member, 9: lower shielding member, 10: trans 11: element isolation film, 12: inner wire, 13: via

What is claimed is:

1. A semiconductor device, comprising:
an internal circuit region in which an amplifier circuit is formed;
a peripheral region disposed on an outer periphery of the internal circuit; and
a first inductor and a second inductor that are formed in the peripheral region,
wherein the first inductor and the second inductor include metal layers formed in a plurality of wiring layers,
wherein, in each of the wiring layers, each of the metal layer of the first inductor and the metal layer of the second inductor spirally extends in a same direction as each other from an inner periphery of the peripheral region to an outer periphery of the peripheral region, and
wherein the metal layer of the first inductor and the metal layer of the second inductor are arranged adjacent to each other.

2. The semiconductor device, according to claim 1, wherein the first inductor is coupled to a non-inverting input of the amplifier circuit, and
wherein the second inductor is coupled to an inverting input of the amplifier circuit in an opposite phase to the first inductor.

3. The semiconductor device, according to claim 1, wherein a first amplifier circuit and a second amplifier circuit are formed in the internal circuit region,
wherein the first inductor is coupled to a non-inverting input of the first amplifier circuit, and the second inductor is coupled to a non-inverting input of the second amplifier circuit in an opposite phase to the first inductor,
wherein an output of the first amplifier circuit is fed back to an inverting input of the first amplifier circuit, and an output of the second amplifier circuit is fed back to an inverting input of the second amplifier circuit, and
wherein the inverting input of the first amplifier circuit and the inverting input of the second amplifier circuit are coupled to each other through a resistance.

4. The semiconductor device, according to claim 1, wherein the wiring layers include a first wiring layer and a second wiring layer formed just above or just below the first wiring layer,
wherein the metal layer of the first inductor formed in the first wiring layer is placed at a same position as the metal layer of the first inductor formed in the second wiring layer in a plan view, and
wherein the metal layer of the second inductor formed in the first wiring layer is placed at a same position as the metal layer of the second inductor formed in the second wiring layer in the plan view.

5. The semiconductor device, according to claim 4, wherein the metal layer of the first inductor formed in the first wiring layer is electrically coupled to the metal layer of the first inductor formed in the second wiring layer through a first via, and
wherein the metal layer of the second inductor formed in the first wiring layer is electrically coupled to the metal layer of the second inductor formed in the second wiring layer through a second via.

6. The semiconductor device, according to claim 1, wherein the wiring layers include a first wiring layer and a second wiring layer formed just above or just below the first wiring layer,
wherein the metal layer of the first inductor formed in the first wiring layer is placed at a position different from the metal layer of the first inductor formed in the second wiring layer in a plan view, and
wherein the metal layer of the second inductor formed in the first wiring layer is placed at a position different from the metal layer of the second inductor formed in the second wiring layer in the plan view.

7. The semiconductor device, according to claim 1, wherein wiring layers of the amplifier circuit are formed in the wiring layers in the internal circuit region.

8. The semiconductor device, according to claim 1, wherein shielding members are provided to cover the first inductor and the second inductor on upper, lower, left and right sides.

9. An amplifier circuit, comprising:
an operational amplifier circuit including a non-inverting input and an inverting input;

a first inductor; and a second inductor, wherein the non-inverting input of the operational amplifier circuit is coupled to a reference potential through the first inductor, wherein the inverting input of the operational amplifier circuit is coupled to the second inductor in an opposite phase to the first inductor, wherein the output of the operational amplifier circuit is fed back to an inverting input of the operational amplifier circuit through a first resistance and through the second inductor, wherein the operational amplifier circuit, the first inductor, and the second inductor are formed over a single semiconductor substrate, wherein the first inductor and the second inductor include metal layers formed in a plurality of wiring layers that are formed over the semiconductor substrate, wherein, in each of the wiring layers, each of the metal layer of the first inductor and the metal layer of the second inductor spirally extends in a same direction as each other from an inner periphery of a peripheral region disposed on an outer periphery of a region in which the operational amplifier circuit is formed to an outer periphery of the peripheral region, and wherein the metal layer of the first inductor and the metal layer of the second inductor are arranged adjacent to each other.

10. The amplifier circuit, according to claim 9, wherein a potential point to which the output of the operational amplifier circuit is fed back is coupled to the reference potential through a second resistance.

11. The amplifier circuit, according to claim 9, wherein the amplifier circuit includes a first chip and a second chip, each of the first chip and the second chip including the single semiconductor substrate over which the operational amplifier circuit, the first inductor, and the second inductor are formed, and wherein a potential point to which the output of the operational amplifier circuit of the first chip is fed back, and a potential point to which the output of the operational amplifier circuit of the second chip is fed back are coupled to each other through a second resistance.

12. An amplifier circuit, comprising:

a first operational amplifier circuit and a second operational amplifier circuit, each including a non-inverting input and an inverting circuit;

a first inductor; and a second inductor, wherein a non-inverting input of the first operational amplifier circuit is coupled to a reference potential through the first inductor, wherein a non-inverting input of the second operational amplifier circuit is coupled to the reference potential through the second inductor that is coupled in an opposite phase to the first inductor, wherein an output of the first operational amplifier circuit is fed back to the inverting input of the first operational amplifier circuit though a first resistance, wherein an output of the second operational amplifier circuit is fed back to the inverting input of the second operational amplifier circuit through a second resistance, wherein a potential point to which the output of the first operational amplifier circuit is fed back, and a potential point to which the output of the second operational amplifier circuit is fed back are coupled to each other through a third resistance, wherein the first operational amplifier circuit, the second operational amplifier circuit, the first inductor, and the second inductor are formed over a single semiconductor substrate, wherein the first inductor and the second inductor include metal layers formed in a plurality of wiring layers formed over the semiconductor substrate, wherein, in each of the wiring layers, each of the metal layer of the first inductor and the metal layer of the second inductor spirally extends in a same direction from an inner periphery of a peripheral region disposed on an outer periphery of a region in which the first operational amplifier circuit and the second operational amplifier circuit are formed to the outer periphery of the peripheral region, and wherein the metal layer of the first inductor and the metal layer of the second inductor are arranged adjacent to each other.

* * * * *